United States Patent [19]

Arumugham et al.

[11] 4,153,914
[45] May 8, 1979

[54] NETWORK FOR APPLYING A PLURALITY OF CONTROL VOLTAGES TO A COMMON CONTROL TERMINAL

[75] Inventors: Rangaswamy Arumugham, Batavia; George H. Kam, Tonawanda, both of N.Y.

[73] Assignee: GTE Sylvania Incorporated, Stamford, Conn.

[21] Appl. No.: 892,118

[22] Filed: Mar. 31, 1978

[51] Int. Cl.$^2$ .......................... H04N 5/50; H04B 1/16; H03K 5/00
[52] U.S. Cl. .................................. 358/195; 325/464; 325/422; 334/15; 307/261; 328/158
[58] Field of Search ............... 358/191, 195; 325/418, 325/420, 422, 423, 459, 464, 465; 334/1, 15, 16; 333/70 CR, 19, 6; 328/127, 14, 158, 156, 157; 331/36 R, 36 C; 307/320, 261, 108, 109

[56] References Cited

U.S. PATENT DOCUMENTS

| | | | |
|---|---|---|---|
| 3,959,728 | 5/1976 | Yamazaki et al. | 358/195 |
| 4,005,256 | 1/1977 | Arumugham | 325/464 |

*Primary Examiner*—John C. Martin
*Attorney, Agent, or Firm*—John A. Odozynski

[57] ABSTRACT

A network for combining a switchable and variable tuning voltage with an AFC voltage so as to effect a change in the tuning control voltage at a tuner's tuning control terminal is disclosed. The network compensates for time delays associated with the AFC time-constant in a manner such that the tuning control voltage responds in proportion to and substantially instantaneously with changes in the tuning voltage. The compensation reduces the probability of AFC false-locking phenomena when, for example, switching from one channel of a television receiver to another.

5 Claims, 3 Drawing Figures

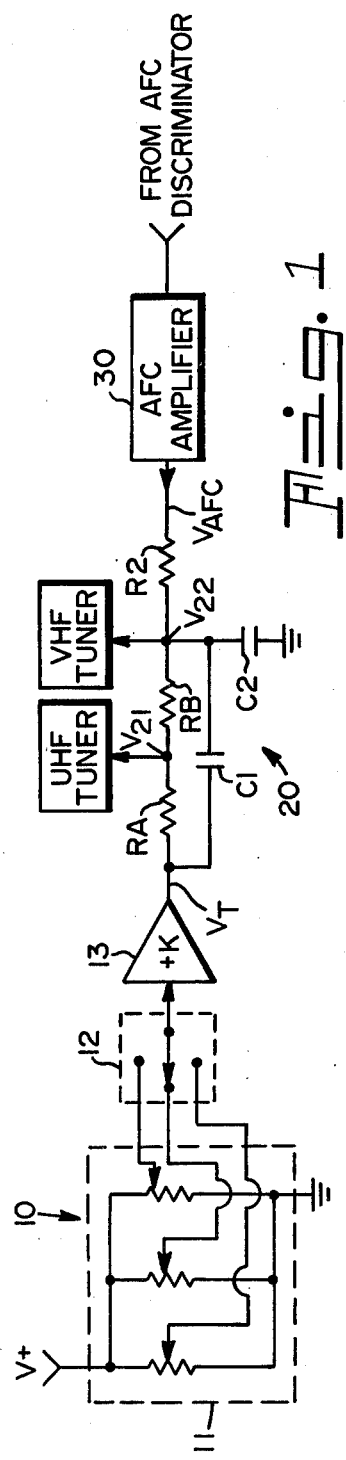
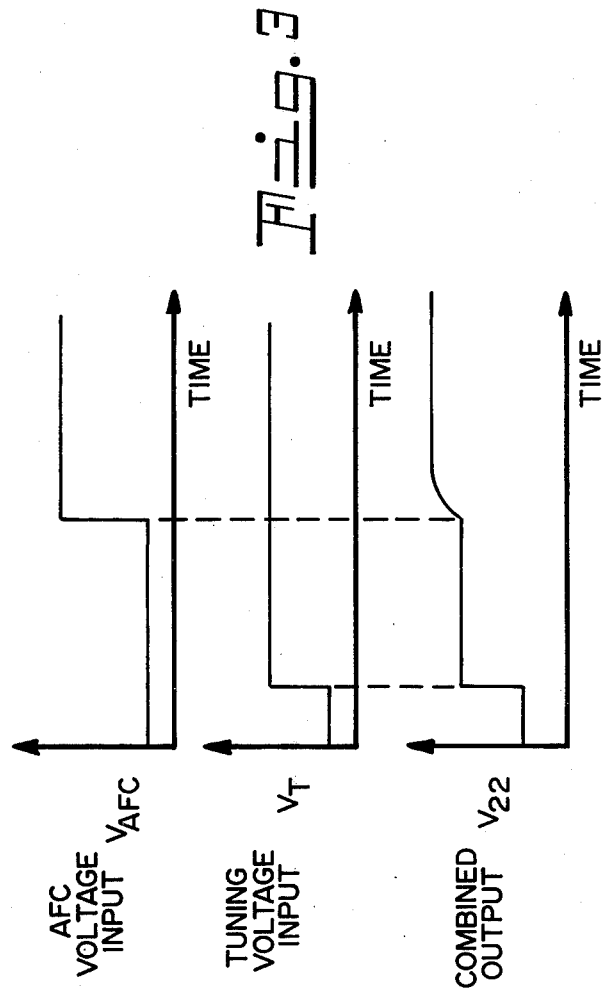
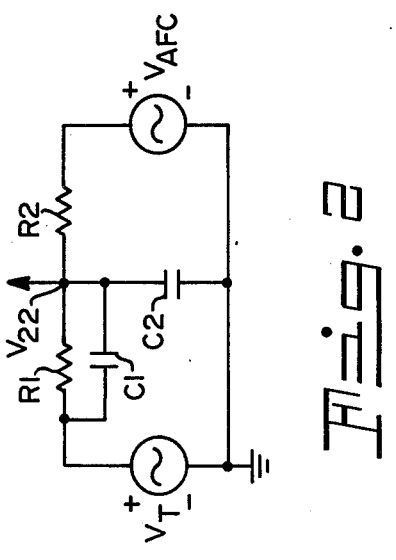

NETWORK FOR APPLYING A PLURALITY OF CONTROL VOLTAGES TO A COMMON CONTROL TERMINAL

FIELD OF THE INVENTION

This invention relates to electronic tuning networks for television receivers and in particular to a circuit for combining a tuning voltage with an AFC voltage and for compensating the resulting tuning control voltage for delays associated with the AFC time-constant.

BACKGROUND OF THE INVENTION

In television receivers having tuners whose frequency of operation depends on a voltage applied to a tuning control terminal, it is often convenient to combine the nominal tuning voltage for a given channel with an automatic frequency control (AFC) voltage in order to effect the precise frequency of operation. In conjunction with varactor tuners, U.S. Pat. No. 3,952,143, "Wideband AFC System", by Siwko describes a novel network for combining the tuning voltage with the AFC voltage in a manner that provides an AFC correction voltage range that compensates for variations in tuning voltage sensitivity. An alternate approach is described in U.S. Pat. No. 4,005,256, "AFC Circuit", by Arumugham.

Although these circuits offer significant performance improvements, interaction between the tuning voltage and the AFC voltage has been found to pose some subtle difficulties. For examaple, in order to assure the stability of the AFC system and provide the desired AFC time-constant, the AFC voltage is typically coupled through an appropriate Resistor-Capacitor (RC) network to the tuning control terminal. In a particular embodiment the AFC voltage may be resistively coupled to the tuning control terminal and the terminal in turn coupled through a relatively large valued capacitor (on the order of one microfarad) to circuit ground. The capacitor tends to interact with the tuning voltage so that some time delay is experienced between an instantaneous change in tuning voltage — as occurs when switching from one channel to another — and the appearance of a corresponding change in the voltage applied to the tuning control terminal. In switching from the nominal tuning voltage of an initial channel to the nominal tuning voltage of a subsequently chosen channel, the tuning voltage may temporarily take on a value corresponding to the frequency of an adjacent sound or picture carrier. As a result the AFC will have a tendency to lock onto the undesired carrier, to the exclusion of the desired signal.

In addition, transient overshoots in the tuning control voltage can cause the receiver's local oscillator to be temporarily tuned to a frequency beyond the desired frequency of operation. That is, when the tuning control voltage is switched from an existing voltage to a lower voltage, the overshoots can cause the local oscillator to be temporarily tuned to a frequency below the desired frequency; conversely, when the tuning control voltage is switched to a higher voltage, the local oscillator may be temporarily tuned to a frequency above the desired frequency. In the event that the overshoots are of sufficient amplitude either the desired channel's associated sound carrier or the upper adjacent channel's sound carrier may be brought within the pull-in range of the AFC system and false-lock may again occur.

OBJECTS OF THE INVENTION

It is an object of this invention to provide a circuit for combining a switchable tuning voltage with an AFC control voltage at the tuning control terminal of a voltage-controlled tuner.

It is a further object of the invention that the circuit allow the tuning control voltage to respond in proportion to and substantially instantaneously with changes in the tuning voltage.

It is a further object of the invention to obviate delays in the response to changes in the tuning voltage associated with the AFC time-constant.

It is a further object of the invention to provide such a circuit so that the AFC time-constant may be chosen without concern for its effect on the rate at which the tuning control voltage changes as the receiver is switched from one channel to another.

It is a further object of the invention to compensate for the effects of the AFC time-constant without causing an overshoot in the change in tuning control voltage that results from a change in tuning voltage.

DESCRIPTION OF THE DRAWINGS

FIG. 1 is a schematic diagram of a compensated combining network with conventional co-operating elements shown in a block form.

FIG. 2 is an equivalent representation of the circuit of FIG. 1.

FIG. 3 consists of waveforms depicting the effect of instantaneous changes in both the AFC voltage and the tuning voltage on the voltage at the tuning control terminal.

SUMMARY OF THE INVENTION

The above and other objects, advantages, and capabilities are achieved in one aspect of this invention by a network comprising first and second resistive means for coupling first and second sources of control voltage to a control terminal and a first capacitive means coupled between the first source of control voltage and the control terminal. A second capacitive means coupled between the control terminal and ground establishes, in conjunction with the first capacitive means, the manner in which the voltage at the control terminal changes in response to a change in the voltage developed by the second source of control voltage. As a result, a step change in the first control voltage results in a step change in the voltage at the control terminal whereas a step change in the second control voltage results in an integrated change in the voltage at the control terminal.

DESCRIPTION OF THE PREFERRED EMBODIMENT

For a better understanding of the present invention, together with other and further objects, advantages and capabilities thereof, reference is made to the following disclosure in conjunction with the accompanying drawings.

As illustrated in FIG. 1, a tuning voltage $V_T$ is developed by a source of tuning voltage 10. Source 10 includes a source of potential voltage $V^+$, a bank of potential dividing resistors 11, a switching apparatus 12, and a buffer amplifier 13. Although only three resistors are shown, it is common to provide a resistor for each VHF channel and for each of an appropriate number of UHF channels. The resistors are connected between $V^+$ and circuit ground and are adjusted so that the voltage on their wipers is substantially equal to the nominal tuning voltage of the corresponding channel. Depending on the type of tuner used and on the channel selected, the voltage may have a value ranging from approximately 2 to 28 volts. The wipers of the potential dividing resistors are connected to the switching apparatus 12 and coupled to the input of the buffer amplifier 13 according to the channel selected. The specific structure of apparatus 12 is not of paramount importance to the subject invention and it may be one of various forms of known electronic or mechanical construction. Buffer 13, which may be characterized by a gain factor K (often equal to one), transforms the relatively high resistance of the potential dividing resistors to a negligibly low source impedance for the tuning voltage $V_T$.

As compensated combining network 20 comprises a resistor RA coupling $V_T$ to the tuning control terminal 21 of a UHF tuner and a series-connected resistor RB connecting terminal 21 to the tuning control terminal 22 of a VHF tuner. Terminal 22 is coupled through a resistor R2 to the AFC voltage, $V_{AFC}$, at the output of an AFC amplifier 30, through a capacitor C2 to circuit ground, and through a capacitor C1 to $V_T$, that is, to the output of the buffer amplifier. The AFC amplifier 30 also has a negligibly low source impedance. Otherwise its operation is not a prerequisite to an understanding of the subject invention and is fully described in U.S. Pat. No. 3,952,143, referred to above. However, the combining network described in that (or any other known) AFC system does not contain a capacitor similar to capacitor C1 of the subject invention. The effect is as follows.

Assuming, for simplicity, that the output of the AFC amplifier is zero volts at a source impedance of zero ohms, that is, a short-circuit to ground. When switching from one VHF channel having, for example, a tuning voltage of X volts to a VHF channel having a tuning voltage of (X+Y) volts, then the rate of change of the voltage at terminal 22 will be proportional to $$Ae^{-Bt}$$

Where: $A = \dfrac{Y(RA + RB + R2)}{(RA + RB)(R2)(C1 + C2)}$ $B = \dfrac{(RA + RB + R2)}{(RA + RB)(R2)(C1 + C2)}$ As pointed out above, the less than instantaneous change in voltage at the tuning control terminal exacerbates false-locking occurrences in the AFC system as the receiver is switched from one channel to another. The probability that the AFC system will lock on to an undesired carrier signal is inversely related to the rate of change of the receiver's local oscillator frequency and, hence, the rate of change of the tuning control voltage (Cf., Gardner, "Phase-lock Techniques", John Wiley and Sons, 1966; pp. 46-50.) The compensated combining network of the subject invention, including capacitor C1, circumvents such effects by developing a substantially instantaneous change in the tuning control voltage in response to a change in $V_T$. The equivalent circuit of FIG. 1, as depicted in FIG. 2, will facilitate an understanding of the manner in which this is accomplished. It should be noted that in FIG. 2 the resistor R1 represents the equivalent resistance of RA and RB, (RA+RB), in FIG. 1.

With regard to FIG. 2 it can be shown that the general expression for the voltage at the VHF tuning control terminal 22 is:

$$V22 = \dfrac{V_T \times R2(R1C1 + 1)}{(sR1R2C1 + sR1R2C2 + R1 + R2)} + V_{AFC} \times \dfrac{R1}{(sR1R2C1 + sR1R2C2 + R1 + R2)}.$$

In conventional circuits C1 is zero (this is, non-existent) and the expression for V22 is:

$$V22 = \dfrac{V_T \times R2}{(sR1R2C2 + R1 + R2)} + V_{AFC} \times \dfrac{R1}{(sR1R2C2 + R1 + R2)}$$

Accordingly, it can be seen that both the tuning voltage $V_T$ and the AFC voltage have associated time constants which depend on the value of C2. These time contants give rise to time delays whenever either of these voltages is changes. However, if the values of R1, R2, C1 and C2 are chosen so that R1C1=R2C2, then, for the network shown in FIG. 1, the expression above reduces to:

$$V22 = V_T \times \dfrac{R2}{R1 + R2} + V_{AFC} \times \dfrac{R1}{(R1 + R2)(sR2C2 + 1)}$$

In this situation the relationship between the tuning control voltage and $V_T$ is independent of capacitors C1 and C2 and is no longer affected by the AFC time-constant. As a result the tuning control voltage will be able to change in proportion to and substantially instantaneously with changes in the tuning voltage $V_T$. In addition, because the dependence on C1 and C2 has been eliminated, their values can be chosen to provide the desired AFC time-constant without concern for the effect on the rate at which the tuning control voltage changes as the receiver is switched from one channel to another.

In this regard it should be noted that, although the expression immediately above would seem to indicate that the AFC time-constant is dependent only on C2, the expression is valid only for the condition that R1C1=R2C2 so that, in fact, the AFC time-constant is dependent on both C1 and C2, as indicated by the general expression for $V_{22}$. However, so long as the condition that R1C1=R2C2 is satisfied, the AFC time-constant may be established as desired without attendant effects on the rate at which the tuning control voltage changes in response to changes in $V_T$.

FIG. 3 illustrates tha relative effects of instantaneous changes in both $V_T$ and $V_{AFC}$ on the tuning control voltage $V_{22}$. Note that $V_{22}$ responds substantially instantaneously to a step increment in $V_T$, thereby allowing the receiver's local oscillator to be immediately tuned to or near the desired frequency of operation. However, step increments in $V_{AFC}$ are integrated, that is, time-delayed, before being combined with $V_T$ and applied to the tuning control terminal. In addition to maintaining the stability of the AFC system, the time-delay assures that the AFC correction voltage is not swept so rapidly as to preclude locking on the desired channel picture carrier in the event that the receiver is tuned somewhat off the desired frequency. (See, Gardner, supra)

While there has been shown and described what is at present considered the preferred embodiments of the invention it will be obvious to those skilled in the art that various changes and modifications may be made therein without departing from the invention as defined by the appended claims.

What is claimed is:

1. A network comprising:
   first resistive means for coupling a first source of control voltage to a control terminal;
   a second resistive means for coupling a second source of control voltage to the control terminal;
   a first capacitive means coupled between the first source of control voltage and the control terminal;
   second capacitive means coupled between the control terminal and circuit ground for establishing, in conjunction with the first capacitive means, the manner in which the voltage at the control terminal changes in response to a change in the voltage developed by the second source of control voltage, wherein the above first and second resistive means and first and second capacitive means are so arranged that a step change in the voltage developed by the first source of control voltage results in a step change in the voltage at the control terminal whereas a step change in the voltage developed by the second source of control voltage results in an integrated change in the voltage at the control terminal.

2. In a television receiver having a voltage-controlled tuner, a source of selectable tuning voltage and a source of AFC voltage, a compensated network for combining the tuning voltage and the AFC voltage comprising:
   first resistive means for coupling the tuning voltage to the tuner's tuning control terminal;
   second resistive means for coupling the AFC voltage to the tuner's tuning control terminal;
   first capacitive means coupled between the source of tuning voltage and the tuning control terminal; and
   second capacitive means coupled between the tuning control terminal and circuit ground for establishing, in conjunction with the first capacitive means, the AFC time-constant, said resistive and capacitive means so arranged that the voltage at the tuning control terminal responds substantially instantaneously to changes in the tuning voltage.

3. A network as defined in claim 1 or claim 2 wherein the first resistive means, second resistive means, first capacitive means and second capacitive means have effective values respectively equal to R1, R2, C1 and C2 and wherein these values have substantially the following relationship:

$$R1 \times C1 = R2 \times C2,$$

4. A network as defined in claim 2 wherein the tuning control terminal is the VHF tuning control terminal and wherein the first resistive means comprises a first resistor connected between the source of tuning voltage and a UHF tuning control terminal and a second resistor connected between the UHF tuning control terminal and the VHF tuning control terminal.

5. A network as defined in claim 4 wherein the first and second resistors have respective effective values equal to RA and RB and wherein the first resistive means, second resistive means, first capacitive means and second capacitive means have effective values respectively equal to R1, R2, C1, and C2, R1 being equal to RA+RB, and wherein these values have substantially the following relationship:

$$R1 \times C1 = R2 \times C2.$$

* * * * *